(12) United States Patent
Devoe et al.

(10) Patent No.: US 7,035,080 B1
(45) Date of Patent: Apr. 25, 2006

(54) COMBINED MULTILAYER AND SINGLE-LAYER CAPACITOR FOR WIREBONDING

(76) Inventors: Lambert Devoe, 3446 Stadium Pl., San Diego, CA (US) 92122; Alan Devoe, 5715 Waverly Ave., La Jolla, CA (US) 92037; Daniel Devoe, 1106 Barcelona Dr., San Diego, CA (US) 92107

( * ) Notice: Subject to any disclaimer, the term of this patent is extended or adjusted under 35 U.S.C. 154(b) by 26 days.

(21) Appl. No.: 10/994,866

(22) Filed: Nov. 22, 2004

(51) Int. Cl.
*H01G 4/228* (2006.01)
*H01G 4/005* (2006.01)

(52) U.S. Cl. .................................... 361/306.1; 361/303
(58) Field of Classification Search .. 361/301.3–301.4, 361/303, 306.1, 306.2, 306.3, 311–313, 309, 361/308.1, 308.2, 308.3
See application file for complete search history.

(56) References Cited

U.S. PATENT DOCUMENTS

| 4,247,881 | A | 1/1981 | Coleman |
|---|---|---|---|
| 4,665,465 | A | 5/1987 | Tanabe |
| 5,576,926 | A | 11/1996 | Monsorno |
| 5,930,106 | A | 7/1999 | Deboer et al. |
| 5,978,204 | A | 11/1999 | Stevenson |
| 6,052,272 | A | 4/2000 | Kuroda et al. |
| 6,208,501 | B1 | 3/2001 | Ingalls et al. |
| 6,337,791 | B1 | 1/2002 | Monsorno |
| 6,366,443 | B1 | 4/2002 | Devoe et al. |
| 6,414,835 | B1 | 7/2002 | Wolf et al. |
| 6,418,009 | B1 | 7/2002 | Brunette |
| 6,515,842 | B1 | 2/2003 | Hayworth et al. |
| 6,542,352 | B1 | 4/2003 | Devoe et al. |
| 6,587,327 | B1 | 7/2003 | Devoe et al. |
| 6,751,082 | B1 | 6/2004 | Devoe et al. |
| 6,753,218 | B1 | 6/2004 | Devoe et al. |
| 6,816,356 | B1 | 11/2004 | Devoe et al. |

FOREIGN PATENT DOCUMENTS

JP 2000-106320 4/2000

*Primary Examiner*—Eric W. Thomas
(74) *Attorney, Agent, or Firm*—Wood, Herron & Evans, L.L.P.

(57) ABSTRACT

A substrate includes a single-layer capacitor and various external contacts. A first external contact provides a first electrical connection to the single-layer capacitor. A second external contact provides a second electrical connection to the single-layer capacitor. The first and third external contacts are electrically connectable to another electrical component, and internal metallization structures or vias of conductive material electrically connect the second contact and the third contact to facilitate the single-layer capacitor being connectable in a parallel circuit with the other electrical component.

25 Claims, 2 Drawing Sheets

COMBINED MULTILAYER AND SINGLE-LAYER CAPACITOR FOR WIREBONDING

FIELD OF THE INVENTION

The present invention relates to miniature monolithic capacitors.

BACKGROUND OF THE INVENTION

The development of integrated circuits has made it possible to place many circuit elements in a single semiconductor chip. Where part or all of the circuit is an analog circuit, such as a radio frequency transmitter or receiver, audio amplifier, or other such circuit, circuit design requires lumped elements that cannot be readily realized in monolithic integrated circuits. Capacitors in particular are frequently created as separate elements from the integrated circuit. The electronic device thus typically includes monolithic integrated circuits combined with external capacitors.

For such applications, monolithic ceramic capacitors have been used. For example, single capacitors made of ceramic materials, are known in the art. These are relatively small in size and can be surface mounted to a surface mount circuit board, or glued and wire bonded to a substrate in a hybrid circuit layout.

In an ideal model of a lumped element capacitor, the capacitor provides an ideal voltage/current relationship:

$$i = C \frac{dv}{dt}$$

Unfortunately, particularly at high frequencies, capacitors used in electronic circuits deviate substantially from this ideal relationship. These deviations are generally modeled as an equivalent series resistance and equivalent series inductance, along with a capacitance that varies over frequency. In accordance with this model, a capacitor behaves as a series L-R-C circuit. At lower frequencies, the dominant impedance is the capacitive element C. However, at increasing frequencies, the impedance of the capacitive element C decreases; and the impedance of the inductive element L increases. Then, at the resonant angular frequency $(LC)^{-0.5}$, the inductive element becomes predominant; and the element ceases performing as a capacitor. Simultaneously, the capacitor dissipates some stored energy (typically through heating of conducting plates and traces), as represented by the series resistance R.

Capacitor design typically must compromise between capacitance value and equivalent series resistance and inductance; greater capacitance typically can be created only at the cost of increased series resistance and inductance. Accordingly, equivalent series resistance and inductance are not avoidable, and electronic design must take them into account, particularly in high frequency products such as broadband receiver/transmitters, short wave devices, and the like.

Various monolithic ceramic structures have been developed to provide relatively small capacitors for highly integrated applications. A first such structure is known as a "multilayer ceramic capacitor". This structure is formed by stacking sheets of green tape or greenware, i.e., thin layers of a powdered ceramic dielectric material held together by a binder that is typically organic. Such sheets, typically, although not necessarily, are of the order of five inches by five inches, can be stacked with additional layers, thirty to one hundred or so layers thick. After each layer is stacked, conductive structures are printed on top of the layer, to form internal plates that form the desired capacitance. When all layers are stacked, they are compressed and diced into capacitors. Then, the compressed individual devices are heated in a kiln according to a desired time-temperature profile, driving off the organic binder and sintering or fusing the powdered ceramic material into a monolithic structure. The device is then dipped in conductive material to form end terminations for the internal conductive structures, suitable for soldering to a surface mount circuit board or gluing and wire bonding to a hybrid circuit.

The design of known broadband capacitors involves a tradeoff between capacitance value and broadband performance. One known approach to managing series resistance and series inductance, is to parallel connect a multilayer capacitor with a single-layer capacitor. The larger value capacitor is chosen for its large capacitance value and is parallel connected to the smaller value capacitor that is chosen for its small equivalent series resistance. As will be appreciated, such a circuit exhibits multiple resonant frequencies, a first at the frequency $(L1C1)^{-0.5}$, and a second at the frequency $(L2C2)^{-0.5}$. Typically the larger valued capacitor has the larger series resistance and inductance value and thus, the lower resonant frequency. The smaller valued capacitor is chosen for high frequency performance resulting from low series resistance and series inductance values. At lower frequencies, the larger capacitor will produce acceptable performance; however, at higher frequencies, where the larger capacitor behaves increasingly less like a capacitor and more like an inductance, the smaller capacitor will be below its resonant frequency and perform well as a capacitor throughout the frequency of interest.

The parallel capacitor approach has been utilized in conjunction with ceramic chip capacitors to improve the high frequency performance of those capacitors. Multilayer and single-layer capacitor combinations are often designed to utilize surface mount technologies; and therefore, the capacitor terminal plates or contacts are on opposed upper and lower sides of the capacitor. In applications where it is desirable to use wirebonding connections, it is necessary to provide electrical connections with a wire bonded to an upper contact. As shown in FIG. 4, an integrated broadband capacitor 18 has a multilayer capacitor 20 with sets of opposed and parallel plates 21, 23 disposed in a ceramic dielectric body 25. Each set of plates 21, 23 is electrically connected to a different one of the conductive contacts 22, 24 on opposite sides of a ceramic dielectric body 26 in a known manner. A higher frequency, single-layer capacitor 28 is formed from opposed plates 30, 32 that also serve as end contacts, with the contact 32 being electrically connected to a conductor 34. The multilayer capacitor 20 is connected in parallel with a single-layer capacitor 28 to provide an equivalent circuit shown in FIG. 4A. A connecting wire 36 connects an integrated circuit ("IC") 38 with the contact 30 of the single-layer capacitor 28. The connecting wire 36 is relatively long; and the inductance of the wire 36 increases loss in the system, thereby adversely affecting its performance.

Referring to FIG. 5, another known integrated broadband capacitor 40 made for wirebonding also has an equivalent circuit of parallel connected capacitors as shown in FIG. 4A. The integrated capacitor 40 also has the multilayer capacitor 20 identical to the multilayer capacitor 20 of FIG. 4. The multilayer capacitor 20 is connected to a double single-layer capacitor 42. The double single-layer capacitor is a substrate-like piece containing two single-layer capacitors. A first capacitor 44 is formed between plate contacts 46, 48. Plate contact 46 is electrically connected by the wire 36 to IC 38, and plate contact 48 is electrically connected to conductor 34. Contact plates 50, 52, which would normally form a capacitor therebetween, are shorted with a silver paste 54 that is fired at about 800 degrees C. A disadvantage of using such a capacitor 42 is that it is difficult to handle a 5 mil thick ceramic device in order to dip the plates 50, 52 in the silver paste; and often, the device is broken in the dipping process.

Thus, there is a need for a multilayer and single-layer broadband capacitor suitable for use with wirebonding that can be produced using existing automated production equipment and processes and does not require special handling and operations.

SUMMARY OF THE INVENTION

The present invention provides a capacitor having an effective broadband performance in an integrated, cost-effective structure that facilitates its use with wirebonding. Further, the integrated capacitor array of the present invention can be produced with existing automated equipment and processes and does not require special handling to make it suitable for wirebonding applications.

In accordance with principles of the present invention, a substrate includes a single-layer capacitor and various external contacts. A first external contact provides a first electrical connection to the single-layer capacitor and is electrically connectable to a first side of another electrical component. A second external contact provides a second electrical connection to the single-layer capacitor. A third external contact is electrically connectable to a second side of the other electrical component, and internal metallization structures or vias of conductive material electrically connect the second contact and the third contact to facilitate the single-layer capacitor being connectable in a parallel circuit with the other electrical component.

In one aspect of the invention, the single-layer capacitor is a lower value, higher frequency, multilayer capacitor, and the other electrical component is a higher value, lower frequency, multilayer capacitor. Those two capacitors are connected in a parallel circuit to form an integrated broadband capacitor.

These embodiments, and the above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION

Figure 1:
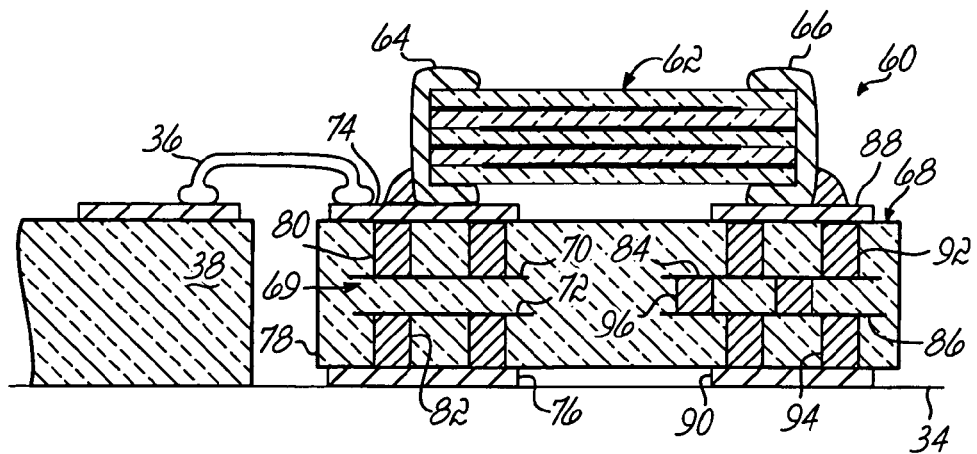
FIG. 1 illustrates one embodiment of an integrated broadband capacitor in accordance with one aspect of the present invention.
Figure 4:
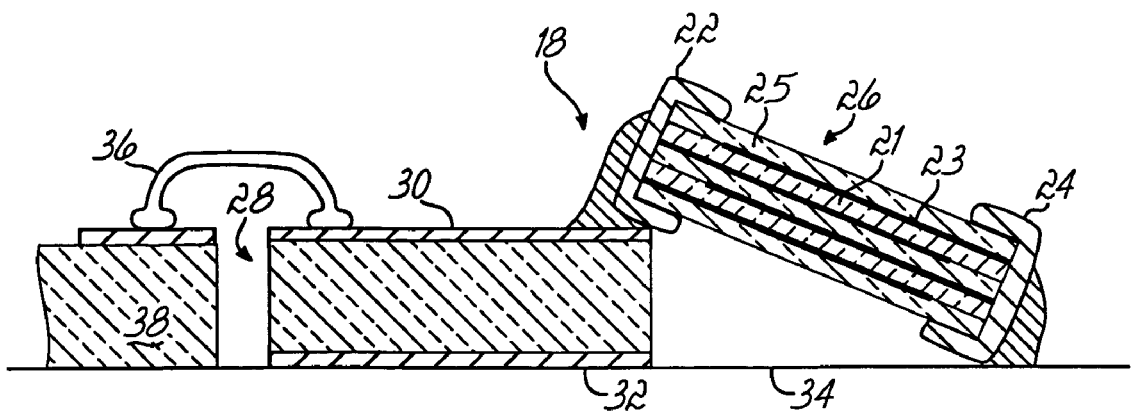
FIG. 4 illustrates a known parallel combination of capacitors to form a broadband capacitor.

Referring now to FIG. 1, in a first embodiment of an integrated broadband capacitor 60, a higher value, lower frequency, multilayer capacitor 62 with conductive contacts 64, 66 is substantially identical to capacitor 20 previously described with respect to FIG. 4. A ceramic dielectric substrate 68, which is normally used to provide two single-layer capacitors, is modified for this application. Often, the substrate 68 is made of a plurality of ceramic tape layers laminated together in a green ceramic state and fired to form a cured monolithic ceramic structure. A lower value, higher frequency, single-layer capacitor 69 is formed at one end of the substrate 68 by two internal plates 70, 72. One or more internal metallization structures or vias of conductive material 80, 82 electrically connect the respective internal plates 70, 72 to respective external contacts 74, 76. Examples of the vias 80,82 are described in U.S. Pat. No. 6,753,218, which patent and the references incorporated therein by reference are hereby incorporated in their entirety herein by reference. The external contacts 74, 76 are printed on the exterior of the substrate 68. External contact 74 is connected by the wire 36 to IC 38, and external contact 76 is electrically connected to the conductor 34.

Figure 4A:
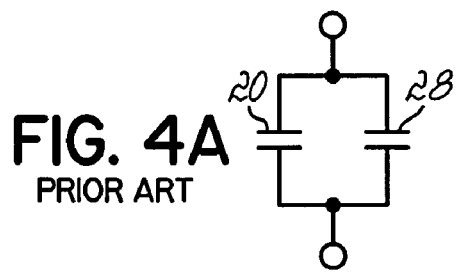
FIG. 4A illustrates an equivalent circuit diagram for this embodiment.
Figure 5:
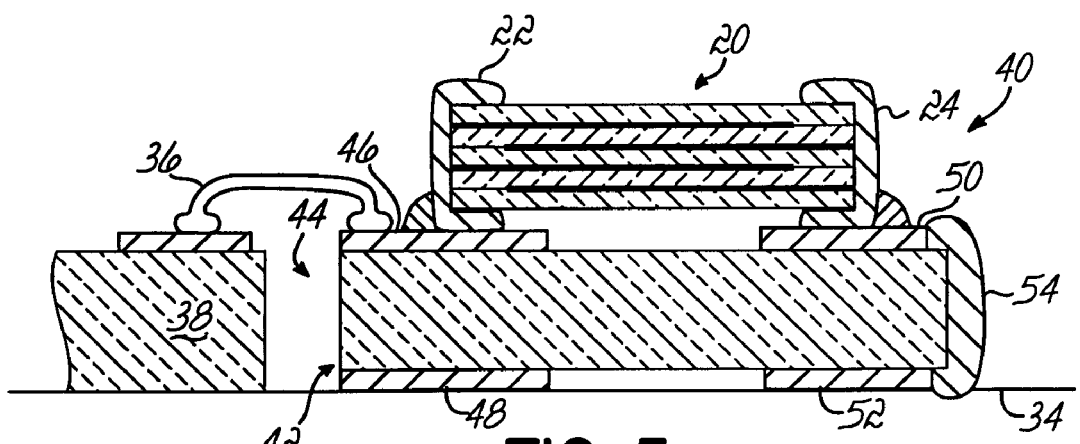
FIG. 5 illustrates another known parallel combination of capacitors to form a broadband capacitor.

At an opposite end of the substrate 68, two internal plates 84, 86 are electrically connected to respective external conductive contacts 88, 90 by one or more internal metallization structures or vias of conductive material 92, 94. The external contact 88 is electrically connected to contact 66 of multilayer capacitor 60, and external contact 90 is electrically connected to the conductor 34. Normally, a capacitor would be formed by the internal plates 84, 86. However, one or more other internal metallization structures or vias of conductive material 96 electrically connect the respective internal plates 84, 86. The plates 84, 86 and vias 92, 94, 96 provide a substantially zero resistance current path through the substrate 68 between the conductive contacts 88, 90 and maintain the conductive contacts 88, 90 at substantially the same voltage potential. Thus, the external contacts 88, 90 in combination with the vias 92, 94, 96 are operable to electrically connect the contact 66 of multilayer capacitor 60 to the conductor 34. Further, the vias 96 cause the integrated broadband capacitor 60 to have an equivalent circuit of parallel connected capacitors 62, 69 identical to that shown in FIG. 4A. The integrated broadband capacitor 60 of FIG. 1 has the advantage of being suitable for use with wirebonding processes while being made with automated production equipment and processes.

Figure 2:
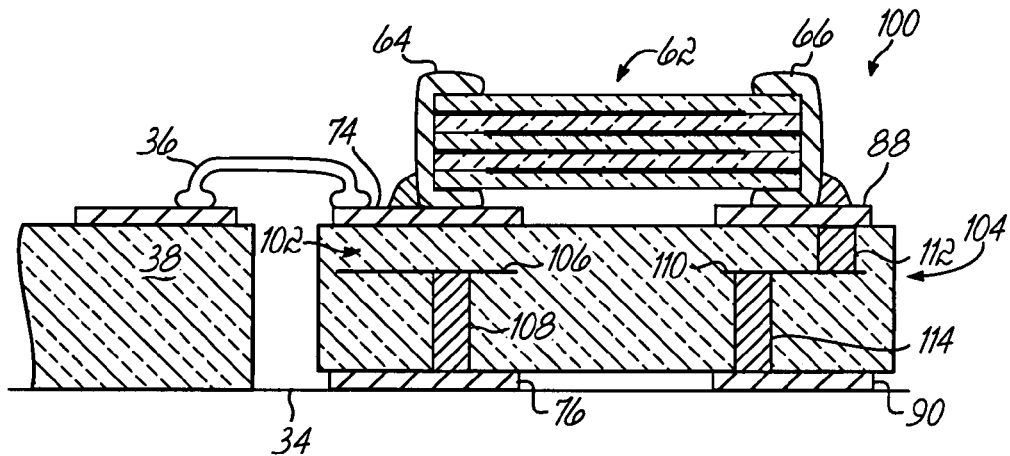
FIG. 2 illustrates another embodiment of an integrated broadband capacitor in accordance with further aspects of the present invention.

In another embodiment, referring to FIG. 2, an integrated broadband capacitor 100 includes the higher value, lower frequency, multilayer capacitor 62 with conductive contacts 64, 66 and a lower value, higher frequency, single-layer capacitor 102 at one end of a ceramic dielectric substrate 104. The lower value, higher frequency capacitor 102 is formed by an internal plate 106 and the external conductive contact 74. One or more internal metallization structures or vias of conductive material 108 connects the internal plate 106 with the external contacts 76. External contact 74 is connected by the wire 36 to IC 38, and external contact 76 is electrically connected to the conductor 34. At an opposite end of the substrate 104, an internal plate 110 is electrically connected to external conductive contacts 88, 90 by one or more respective internal metallization structures or vias 112, 114. The plate 110 and vias 112, 114 provide a substantially zero resistance current path through the substrate 104 between the conductive contacts 88, 90 and maintain the conductive contacts 88, 90 at substantially the same voltage potential. The external contact 88 is electrically connected to contact 66 of multilayer capacitor 60, and external contact 90 is electrically connected to the conductor 34. The internal plate 110 and vias 112, 114 are operable to electrically connect the contact 66 of multilayer capacitor 60 to the conductor 34. Thus, the integrated broadband capacitor 100 has an equivalent circuit of parallel connected capacitors 62, 102 identical to that shown in FIG. 4A.

Figure 3:
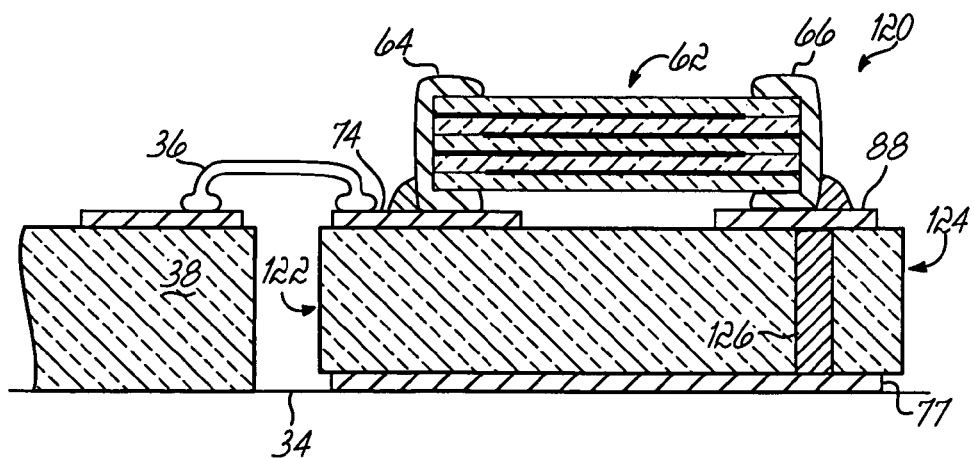
FIG. 3 illustrates a further embodiment of an integrated broadband capacitor in accordance with further aspects of the present invention.

In a further embodiment, referring to FIG. 3, an integrated broadband capacitor 120 includes the higher value, lower frequency, multilayer capacitor 62 with conductive contacts 64, 66 and a higher frequency, single-layer capacitor 122 at one end of a ceramic dielectric substrate 124. The higher frequency capacitor 122 is formed by the external conductive contacts 74, 77. External contact 74 is connected by the wire 36 to IC 38, and external contact 77 extends across a lower side of the substrate 124 and is electrically connected to the conductor 34. At an opposite end of the substrate 124, one or more internal metallization structures or vias of conductive material 126 electrically connect the external contacts 88, 77. The via 126 provides a substantially zero resistance current path through the substrate 124 between the conductive contacts 88, 90 and maintains the conductive contacts 88, 90 at substantially the same voltage potential. The external contact 88 is electrically connected to contact 66 of multilayer capacitor 60. Thus, the vias 126 are operable to electrically connect the contact 66 of multilayer capacitor 60 to the conductor 34, and the integrated broadband capacitor 120 has an equivalent circuit of parallel connected capacitors 62, 122 identical to that shown in FIG. 4A. It should be noted that with the contact 77 differing in length from the contacts 74, 88, the substrate 124 is not reversible in use. However, as will be appreciated, in an alternative embodiment, the contact 77 can be split into two spaced-apart contacts similar to that shown in FIGS. 1 and 2, so that the substrate 124 would then be reversible in use.

While the present invention has been illustrated by a description of various embodiments and while these embodiments have been described in considerable detail, there is no intention to restrict or in any way limit the scope of the appended claims to such detail. Additional advantages and modifications will readily appear to those skilled in the art. Specifically, techniques described in these multiple embodiments may be combined in many ways beyond the particular combinations shown herein. For example, the independently adjustable parameters in forming a device in accordance with aspects of the invention include at least the following:

1. the use, or not, of floating interior plates in the lower value, higher frequency, single-layer capacitors, 2. the gap between the external, conductive contacts on the lower value, higher frequency, single-layer capacitors and any fringe-effect capacitances created thereby, and 3. the relative geometry of external conductive plates or contacts on the higher value, lower frequency multilayer capacitor, the lower value, higher frequency single-layer capacitor, and the conductors or traces to which the components are mounted.

A further potential variable to adjust is the type of ceramic used. Indeed, different layers in the ceramic structure may be made of ceramic materials having different molecular structures. Different ceramic materials may exhibit different performance in various attributes, such as relative dielectric constant, polarization, breakdown field strength, curing behavior, mechanical strength and mechanical stress and strain behavior. For example, a relatively low dielectric ceramic having relatively good high frequency behavior may be used in the lower value, higher frequency, single-layer capacitor, while a relatively high dielectric ceramic having relatively poorer high frequency behavior may be used in the higher value, lower frequency, multilayer capacitor.

The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. An electrical component comprising:
   a substrate comprising
      a single-layer capacitor,
      a first conductive external contact providing a first electrical connection to the single-layer capacitor,
      at least one conductive external contact providing a second electrical connection to the single-layer capacitor,
      a third conductive external contact, and
      internal metallization structures electrically connecting the at least one contact and the third contact to maintain the at least one contact and the third contact at substantially the same voltage potential and facilitate the single-layer capacitor being connectable in a parallel circuit with another electrical component.

2. The electrical component of claim 1 wherein the at least one contact further comprises:
   one conductive external contact providing the second electrical connection to the single-layer capacitor and electrically connectable to a conductor; and
   another conductive external contact electrically isolated from the one conductive external contact, the other conductive external contact electrically connected to the metallization structures and electrically connectable to the one external contact.

3. An electrical component comprising:
   a substrate comprising
      a single-layer capacitor,
      a first conductive external contact providing a first electrical connection to the single-layer capacitor,
      a second conductive external contact providing a second electrical connection to the single-layer capacitor,
      a third conductive external contact;
      a fourth conductive external contact; and
      internal metallization structures electrically connecting the fourth contact and the third contact to maintain the fourth contact and the third contact at substantially the same voltage potential.

4. The electrical component of claim 3 wherein the single-layer capacitor comprises:
   at least first and second internal plates; and
   at least first and second metallization structures electrically connecting the first and second internal plates with respective first and second external contacts.

5. The electrical component of claim 3 wherein the single-layer capacitor comprises:
   at least one internal plate; and
   at least one metallization structure electrically connecting the at least one internal plate with the second external contact.

6. The electrical component of claim 3 wherein the single-layer capacitor comprises first and second plates formed by the first and second external contacts, respectively.

7. The electrical component of claim 3 wherein the single-layer capacitor is a higher frequency, lowered valued capacitor.

8. The electrical component of claim 3 wherein the internal metallization structures are vias of conductive material.

9. The electrical component of claim 3 wherein the substrate is ceramic.

10. The electrical component of claim 3 wherein the substrate comprises a plurality of ceramic tape layers laminated together in a green ceramic state and fired to form a cured monolithic ceramic structure.

11. The electrical component of claim 3 wherein the substrate comprises ceramic layers of different molecular structure exhibiting different performance in one or more of relative dielectric constant, breakdown field strength, curing behavior, mechanical strength and mechanical stress and strain behavior.

12. The electrical component of claim 3 wherein the second conductive external contact being electrically connectable to the fourth conductive external contact to facilitate the single-layer capacitor being connectable in a parallel circuit with another electrical component.

13. An integrated broadband capacitor comprising:
   a multilayer capacitor having first and second conductive external contacts; and
   a substrate comprising
      a single-layer capacitor,
      a first conductive external contact providing a first electrical connection to the single-layer capacitor and electrically connectable to the first contact of the multilayer capacitor,
      at least one conductive external contact providing a second electrical connection to the single-layer capacitor,
      a second conductive external contact electrically connectable to the second contact of the multilayer capacitor, and
      internal metallization structures electrically connecting the second contact and the at least one conductive external contact to maintain the second contact and the at least one conductive external contact at substantially the same voltage potential and connect the multilayer capacitor in a parallel circuit with the single-layer capacitor.

14. The capacitor of claim 13 wherein the at least one conductive external contact further comprises:
   a third conductive external contact providing a second electrical connection to the single-layer capacitor; and
   a fourth conductive external contact electrically isolated from the third conductive external contact, the fourth conductive external contact electrically connected to the metallization structures and electrically connectable to the third conductive external contact.

15. The capacitor of claim 13 wherein the single-layer capacitor comprises:
   at least first and second internal plates; and
   at least first and second metallization structures electrically connecting the first and second internal plates with respective first and second external contacts.

16. The capacitor of claim 13 wherein the single-layer capacitor comprises:
   at least one internal plate; and
   at least one metallization structure electrically connecting the at least one internal plate with the second external contact.

17. The capacitor of claim 13 wherein the single-layer capacitor comprises first and second plates formed by the first and second external plates, respectively.

18. The capacitor of claim 13 wherein the multilayer capacitor is a lower frequency, higher valued capacitor.

19. The capacitor of claim 13 wherein the single-layer capacitor is a higher frequency, lowered valued capacitor.

20. The capacitor of claim 13 wherein the internal metallization structures are vias of conductive material.

21. The capacitor of claim 13 wherein the multilayer capacitor comprises:
   a dielectric body;
   a first plurality of conductive plates disposed within the dielectric body and electrically connected to the first external contact of the multilayer capacitor; and
   a second plurality of conductive plates disposed in the dielectric body between the first plurality of conductive plates and electrically connected to the second external contact of the multilayer capacitor.

22. The capacitor of claim 13 wherein the substrate is ceramic.

23. The capacitor of claim 13 wherein the substrate comprises a plurality of ceramic tape layers laminated together in a green ceramic state and fired to form a cured monolithic ceramic structure.

24. The capacitor of claim 13 wherein the substrate comprises ceramic layers of different molecular structure exhibiting different performance in one or more of relative dielectric constant, breakdown field strength, curing behavior, mechanical strength and mechanical stress and strain behavior.

25. An integrated broadband capacitor comprising:
   a multilayer capacitor having an external conductive first contact and an external conductive second contact; and
   a substrate comprising
      a single-layer capacitor,
      a first conductive external contact providing a first electrical connection to the single-layer capacitor and electrically connected to the first contact of the multilayer capacitor,
      a second conductive external contact providing a second electrical connection to the single-layer capacitor,
      a third conductive external contact electrically connected to the second contact of the multilayer capacitor;
      a fourth conductive external contact; and
      internal metallization structures electrically connecting the fourth contact and the third contact to maintain the fourth contact and the third contact at substantially the same voltage potential and connect the multilayer capacitor in a parallel circuit with the single layer capacitor.

* * * * *